United States Patent
Furukawa et al.

[11] Patent Number: 6,146,819
[45] Date of Patent: Nov. 14, 2000

[54] SILVER HALIDE PHOTOGRAPHIC LIGHT-SENSITIVE MATERIAL

[75] Inventors: Akira Furukawa; Daichi Miyake, both of Tokyo, Japan

[73] Assignee: Mitsubishi Paper Mills Limited, Tokyo, Japan

[21] Appl. No.: 09/449,414

[22] Filed: Nov. 29, 1999

[30] Foreign Application Priority Data

Nov. 30, 1998 [JP] Japan .................................. 10-340030
May 12, 1999 [JP] Japan .................................. 11-131081
Jun. 29, 1999 [JP] Japan .................................. 11-183008

[51] Int. Cl.[7] ............................. G03C 1/775; G03C 1/91; G03C 1/93; G03C 8/52; G03C 1/30
[52] U.S. Cl. ......................... 430/535; 430/204; 430/227; 430/230; 430/533; 430/534; 430/621; 430/954
[58] Field of Search .................................. 430/621, 954, 430/533, 534, 535

[56] References Cited

U.S. PATENT DOCUMENTS

| | | | |
|---|---|---|---|
| 3,103,437 | 9/1963 | Henn et al. | 430/621 |
| 3,996,154 | 12/1976 | Johnson et al. | 252/312 |
| 4,281,060 | 7/1981 | Usami et al. | 430/954 |
| 4,717,642 | 1/1988 | Watanabe et al. | 430/621 |
| 5,252,696 | 10/1993 | Laas et al. | 528/49 |
| 5,510,233 | 4/1996 | Nakanishi et al. | 430/535 |
| 5,597,682 | 1/1997 | Ishii et al. | 430/535 |

*Primary Examiner*—Richard L. Schilling
*Attorney, Agent, or Firm*—Pillsbury Madison & Sutro LLP

[57] ABSTRACT

There is disclosed a silver halide photographic light-sensitive material which comprises a polyester film support, at least one subbing layer containing a self-emulsifiable isocyanate compound having an ethylene oxide recurring unit and two or more isocyanate groups on the support, and at least one silver halide emulsion layer provided on said subbing layer.

10 Claims, No Drawings

SILVER HALIDE PHOTOGRAPHIC LIGHT-SENSITIVE MATERIAL

BACKGROUND OF THE INVENTION

1. Field of the Invention

This invention relates to a silver halide photographic light-sensitive material using a polyester film support, more specifically, to a silver halide photographic light-sensitive material in which adhesiveness with the polyester film support is improved.

2. Prior Art

As a silver halide photographic light-sensitive material using silver halide, there are a film for making a lithographic plate, a color negative film, a color positive film, a black and white negative film, an X ray film for medical use, a scanner film and a lithographic printing plate and the like. These silver halide photographic light-sensitive materials are prepared by coating a hydrophilic binder such as gelatin, etc. on a polyester film support by aqueous coating and dried. The surface of the polyester film support is generally hydrophobic so that an aqueous coating solution containing gelatin, etc. as a binder is coated on the surface of the polyester film surface as such, adhesiveness between the hydrophilic binder such as gelatin, etc. and the polyester film surface is insufficient.

Particularly when it is used as a lithographic printing plate, a problem of printing endurance sometimes occurs by the cause of peeling of a binder layer on the surface of a printing plate from a support during printing so that it is particularly desirable to be extremely firm in adhesiveness between the support and the binder layer.

There have widely been carried out to provide various kinds of subbing layer(s) on the surface of a polyester film support to improve adhesiveness of the surface of the polyester film support to a hydrophilic binder. For example, in Japanese Provisional Patent Publication No. 140343/1981, there is disclosed an example of a subbing layer using a styrene butadiene type latex, and in Japanese Provisional Patent Publications No. 304249/1988 and No. 538/1989, there are disclosed subbing layers using vinylidene chloride latexes. When a layer containing gelatin, etc. as a binder is provided by using a polyester film support to which a subbing layer prepared by a hydrophobic latex is provided, adhesiveness with the support is improved by the presence of the subbing layer but it is sometimes insufficient.

In the case of a constitution having single subbing layer, it is difficult in many cases to heighten the level of adhesiveness to the extent sufficiently satisfied, and it has widely been investigated to provide subbing layers with double layers in which a subbing layer comprising a hydrophilic resin is further provided on the subbing layer comprising a hydrophobic latex. For example, in Japanese Provisional Patent Publication No. 67787/1978, there is disclosed a two-layer constitution in which a vinylidene chloride latex layer is provided as a first layer and a cellulose ester layer is provided thereon. Also, in Japanese Provisional Patent Publications No. 180537/1989 and No. 202750/1989, there is disclosed a constitution comprising a subbing layer with double layers in which a water-soluble polymer layer such as gelatin, etc. is provided by coating on a vinylidene chloride first layer.

However, in such a constitution comprising a subbing layer with double layers, for developing adhesiveness, it is sometimes necessary to carry out a heat treatment under high temperature conditions such as a hundred and several ten centigrade degree after coating a subbing layer. According to this procedure, there is bad effect to thermal shrinkage property or dimensional stability of the polyester film itself in some cases. Also, it is disadvantageous to provide two-layered undercoating layers in the points of preparation facilities and productivity.

A silver halide photographic light-sensitive material has been produced by using a polyester film which has a subbing layer prepared by the above-mentioned prior art, but adhesiveness with a polyester film is not yet sufficient so that there are cases in which problems of peeling films in the developing treatment or printing, or poor printing endurance, etc. are caused.

A lithographic printing plate utilizing a silver complex diffusion transfer method (DTR method) using silver halide, particularly a lithographic printing plate having physical development nuclei on the silver halide emulsion layer is disclosed, for example, U.S. Pat. No. 3,728,114, U.S. Pat. No. 4,134,769, U.S. Pat. No. 4,160,670, U.S. Pat. No. 4,336,321, U.S. Pat. No. 4,501,811, U.S. Pat. No. 4,510,228, U.S. Pat. No. 4,621,041, etc. In these lithographic printing plates, exposed silver halide crystals are chemically developed by the DTR development to form black silver and form a hydrophilic non-image portion. On the other hand, unexposed silver halide crystals becomes silver complex by a silver salt complexing agent to diffuse on physical development nuclei existing at the surface, and causes physical development to form an image portion mainly comprising ink-receptive physical development silver.

Thus, the surface of the above-mentioned lithographic printing plate is covered by a binder mainly comprising gelatin, and a silver image portion comprising physical development silver is formed on the surface of the binder. Ink is attached only to the silver image portion whereby offset printing is carried out. However, as mentioned above, there are problems that a silver image portion lacks due to mechanical abrasion during printing or due to permeation of a solvent in ink, or ink receptivity is gradually lowered.

SUMMARY OF THE INVENTION

An object of the present invention is to improve adhesiveness of a layer constituting a silver halide photographic light-sensitive material and a polyester film support. Particularly it is to provide a silver halide photographic light-sensitive material which causes no film peeling even when the material is processed with an alkaline developer. Another object of the present invention is to improve adhesiveness of a layer constituting a lithographic printing plate using a silver halide and a polyester film support and to provide a lithographic printing plate in which printing endurance is improved. A further object of the present invention is to provide a silver halide photographic light-sensitive material which can provide high adhesiveness even when only one subbing layer and can endure severe processing conditions such as developing treatment, etc.

The above object of the present invention can be accomplished by a silver halide photographic light-sensitive material which comprises a polyester film support, at least one subbing layer containing a self-emulsifiable isocyanate compound having an ethylene oxide recurring unit and two or more isocyanate groups on the support, and at least one silver halide emulsion layer provided on said subbing layer.

DESCRIPTION OF THE PREFERRED EMBODIMENTS

In the following, the present invention is explained in detail. The present invention relates to a silver halide photographic light-sensitive material using a polyester film as a support. The polyester film support herein mentioned refers to a general polyester film which can be film-formed as a film such as polyethyleneterephthalate or polyethylenenaphthalate, etc. The thickness of the polyester film support to be used in the present invention is generally 50 to 300 μm.

In the polyester film support to be used for the silver halide photographic light-sensitive material, adhesiveness of the support and an aqueous coating film such as a gelatin film, etc. constituting the silver halide photographic light-sensitive material can be firstly improved by proving a subbing layer. Adhesiveness at the interface with a gelatin layer which constitutes the silver halide photographic light-sensitive material is markedly fluctuated by a kind of a binder (a resin) to be used for the subbing layer and drying conditions or heat treatment conditions after coating the subbing layer. It is the characteristic feature of the self-emulsifiable isocyanate compound according to the present invention that it has both of affinity to a hydrophobic polyester film support and to a hydrophilic gelatin film by having both of a hydrophobic portion and a hydrophilic portion in the structure, whereby it can realize good adhesiveness at the interface therebetween. As a resin for the subbing layer to be used in this case, a water-soluble polymer such as gelatin, etc., or a hydrophobic latex or emulsion is preferred. It is the characteristic feature of the present invention that a support in which a subbing layer containing such a resin and the self-emulsifiable isocyanate compound is provided on the surface of a polyester film by coating and drying is used.

The self-emulsifiable isocyanate compound having an ethylene oxide recurring unit and two or more of isocyanate groups to be used in the present invention means a self-emulsifiable isocyanate as disclosed in, for example, Japanese Patent Publication No. 7472/1980 (which corresponds to U.S. Pat. No. 3,996,154), Japanese Provisional Patent Publications No. 222150/1993 (which corresponds to U.S. Pat. No. 5,252,696), No. 71720/1997, No. 328654/1997 and No. 60073/1998. More specifically, there may be mentioned, as an extremely preferred example, a polyisocyanate having an isocyanurate structure which is a circular trimer skeleton formed an aliphatic or alicyclic diisocyanate in the molecule, or a polyisocyanate compound having a structure obtained by adding one-terminal etherified polyethylene glycol, etc. to part of polyisocyanate groups of a polyisocyanate having a biuret structure or a urethane structure in the molecule as a base polymer. A synthetic method of the isocyanate compound having such a structure has been described in the above-mentioned publications. As a specific example of such an isocyanate compound, a compound in which a polyisocyanate obtained by cyclizing trimer of hexamethylene diisocyanate, etc. as a starting material is used as a base polyisocyanate has been known, and is commercially available, for example, as a trade name of DURANATE WB40 or WX1741 (both trade names), etc. available from Asahi Kasei Kogyo K.K.

In the above-mentioned isocyanate compound, an ethylene oxide recurring unit is directly bound to a hydrophobic base polyisocyanate so that it forms an emulsion in which the polyisocyanate portion is separated from an aqueous layer in water, and the polyethylene oxide portion has a self-emulsifiable function which disperses and stabilizes the emulsion. From the fact, in the present invention, an isocyanate group which is inherently deactivated by reacting with water continues to exist stably in water so that when it is added in an aqueous coating solution, usable time thereof is long. On the other hand, during the film forming procedure, an aqueous component in the coating solution evaporates and the emulsion state is rapidly broken and diffused in film components whereby it has a merit that the cross-linking reaction rapidly and smoothly proceeds.

In the above-mentioned self-emulsifiable isocyanate compound, the length of the ethylene oxide recurring unit is preferably a recurring unit number of 5 to 50 or so. If it is less than 5, self-emulsifiable property is poor and stable emulsifiable property cannot be shown in an aqueous solution, while if it exceeds 50, the compound is likely crystallized and becomes a solid so that it is not preferred. Moreover, an isocyanate content in the self-emulsifiable isocyanate compound is preferably within the range of 8 to 25% by weight.

In the present invention, at least one of a subbing layer(s) containing the above-mentioned self-emulsifiable isocyanate compound is/are provided on the polyester film support. The subbing layer may be one layer or may be constituted by two layers or more. One of the characteristic features of the present invention is that a sufficient adhesive property can be provided to the silver halide photographic material required therefor only one layer.

When the subbing layer is a single layer, it is preferred to use the self-emulsifiable isocyanate compound and latex or an emulsion in combination. As the latex or the emulsion to be used in combination with the self-emulsifiable isocyanate compound, there may be mentioned a vinylidene chloride type latex, a styrene acrylate type latex, a styrene butadiene type latex, a urethane type emulsion, a polyester type emulsion, a resin emulsion having a hydrolyzable silyl group. Of these, vinylidene chloride type latex, a urethane type emulsion and a resin emulsion having a hydrolyzable silyl group are preferred. A urethane type emulsion is particularly preferred.

As the vinylidene chloride type latex, particularly preferred example is a latex in which an acrylic type monomer (s) containing 80% by weight or more of vinylidene chloride is/are copolymerized, and most preferably a copolymerized latex with a monomer having a hydroxyl group such as a hydroxyethyl group, etc., as an acrylic type monomer.

As the urethane type emulsion, an aqueous-dispersion type polyurethane emulsion is preferred, and there may be mentioned, for example, a self-emulsifiable polyurethane resin. As the self-emulsifiable polyurethane resin, preferred are those having a hydrophilic group such as a sulfonic acid group, a carboxyl group, a hydroxyl group, a polyethyleneoxy group, etc., in the polyurethane structure, and commercially available various kinds of polyurethane emulsions are preferably used.

The above-mentioned resin emulsion having a hydrolyzable silyl group means an emulsion in which, for example, a vinyl monomer having a silyl group with a hydrolyzable property such an alkoxysilyl group is polymerized by the method such as an emulsion polymerization and dispersed in water as a stable emulsion form, as disclosed in, for example, Japanese Provisional Patent Publications No. 9463/1986, No. 25354/1993, No. 292023/1998, U.S. Pat. No. 5,306,765 and U.S. Pat. No. 5,712,340, etc. It is the characteristic feature that said silyl group exists at the inside of the emulsion in a dispersed state and blocked from water so that it is escaped from being subjected to hydrolysis. However, when a coated film is formed, emulsion is broken and the silyl group is contacted with water to proceed hydrolysis and a silanol group is formed. The silanol group is self-condensed to for a cross-linking structure. It is the characteristic feature of the present invention that the silanol groups are bound by the self-emulsifiable isocyanate compound.

As the hydrolyzable silyl group, there may be mentioned an alkoxysilyl group, a thioalkoxysilyl group, a halogenosilyl group, an acyloxysilyl group, an amidosilyl group, an aminoxysilyl group, an alkenyloxysilyl group, an aminosilyl group, an oximesilyl group, etc., and of these, an alkoxysilyl group is particularly preferred.

As a method of synthesizing a resin emulsion having a hydrolyzable silyl group, when a monomer or an oligomer having a polymerizable double bond and a hydrolyzable silyl group is used, there may be used, as a vinylsilane, vinylmethyldimethoxysilane, vinyltrimethoxysilane, vinyltriethoxysilane, vinyltris(β-methoxyethoxy)silane, etc., and as a (meth)-acryloxyalkyl silane, there may be mentioned, γ-methacryl-oxypropyl trimethoxysilane, γ-methacryloxypropylmethyl dimethoxysilane, γ-acryloxypropyl trimethoxysilane, etc. Moreover, as an example of an oligomer, there may be mentioned a urethane type oligomer having a vinyl group and an alkoxysilyl group as disclosed in Japanese Provisional Patent Publication No. 26022/1985, or a polyether type oligomer, a polyester type oligomer, a polyamide type oligomer, etc.

A content of the self-emulsifiable isocyanate compound in the subbing layer is suitably 1 mg/m$^2$ to 10 g/m$^2$, preferably in the range of 1 mg/m$^2$ to 1 g/m$^2$. The self-emulsifiable isocyanate compound is used in the range of 0.1 to 200% by weight, preferably in the range of 1 to 50% by weight based on the above-mentioned latex or emulsion.

When a subbing layer comprises a single layer, a water-soluble polymer such as gelatin, an inorganic fine particle such as silica, or a polymer bead, etc. having a particle size corresponding to the thickness of a subbing layer (from the thickness of the subbing layer to several times of the layer) may be further contained therein for the purpose of preventing blocking, etc. When a subbing layer is a single layer, the film thickness (dried film thickness) is preferably formed within the range of 0.01 μm to 1 μm. If the thickness is less than the above range, as effect as the subbing layer is difficultly appeared, while if it is formed with a thickness exceeding 1 μm, no improved effect as the subbing layer is admitted and rather bad effect of worsening curling property of the film can be sometimes observed.

Coating and drying of a subbing layer comprising a single layer which contains the self-emulsifiable isocyanate compound and a latex or an emulsion is carried out in the preparation step of the polyester film before stretching or after stretching the film or by off-line. In either of the case, good adhesive property can be obtained. In view of productivity, coating and drying of the subbing layer is preferably carried out before stretching. In general, in the film formation step of a polyester film, a heat treatment is carried out after stretching, and the heat treatment can be carried out in the range of room temperature to a hundred and several tens degree or exceeding 200° C., up to 250° C. without any problem.

In the present invention, the subbing layer may be constituted by two layers. Preferred embodiment in this case is that a first layer adjacent to the polyester film support comprises the above-mentioned hydrophobic latex or emulsion, and a second layer is constituted by a water-soluble polymer such as gelatin, etc. In this case, the self-emulsifiable isocyanate compound is contained at least one of these layers, preferably contained in the second layer. The self-emulsifiable isocyanate compound may not particularly be contained in the first layer, but there is a case where it is preferably contained depending on the hydrophobic latex or emulsion constituting the first layer. The content of the self-emulsifiable isocyanate compound and the ratio thereof to the resin are the same as in the above-mentioned single subbing layer.

The most preferred embodiment in the above-mentioned two-layer constitution is that the first layer comprises vinylidene chloride type latex or a polyurethane type emulsion, and the second layer comprises gelatin and the self-emulsifiable isocyanate compound. The thicknesses (dried film thickness) of the respective subbing layers in the two-layered constitution are each the same as those above-mentioned single subbing layer. In general, the most preferred thickness of the subbing layers is each in the range of 0.03 μm to 0.5 μm.

Coating and drying of the first layer can be carried out in the same manner as in the above-mentioned single layer. Coating of the second layer is carried out after coating and drying of the first layer, and in general, it is carried out after a stretching step of the polyester film. This is because, when the second layer containing a water-soluble polymer such as gelatin, etc., is coated and dried before film stretching, the gelatin layer is broken and torn by stretching to become a discontinuous film whereby there is a case in which a function as a subbing layer cannot be shown or transparency of the film is markedly impaired. Coating and drying of the second layer may be carried out in the preparation step (in-line) of the polyester film or may be carried out in a secondary processing (off-line) separately with the film manufacturing line.

One of the characteristic features in the subbing layer comprising double layers of the present invention is that a sufficient adhesiveness can be obtained by drying at a drying temperature of room temperature to 80° C. or so without heating to a high temperature (for example, 100° C. or higher) after coating the second layer. According to this constitution, there is a merit of not requiring a heat treatment apparatus. Also, another merit of carrying out the drying of the second layer at a relatively low temperature is that it is advantageous for dimensional stability.

That is, in the heat treatment step to be carried out generally after stretching of the film forming polyester film, by increasing crystallinity and relaxing non-crystal orientation, a heat shrinkage ratio is lowered and dimensional stability is improved (for example, edited by KAKO GIJUTU KENKYUKAI, Plastic Film for Industry, 1991, Chapter 4, p. 157). However, when a subbing layer is coated after the above-mentioned heat treatment step, and then, a heat treatment is carried out, a heat shrinkage ratio is changed and dimensional stability is impaired in some cases. The heat treatment after coating the subbing layer acts advantageously for the dimensional stability by the film strength being heightened depending on the composition of the subbing layer, but unstable factors remain due to fluctuation of the heat treatment conditions. Accordingly, it is preferred to not carry out the heat treatment for the stable dimensional stability. A heat treatment at high temperature has heretofore been required to improve adhesiveness of the subbing layer, but the subbing layer of the present invention is particularly preferred in the point that it is not necessary to carry out a heat treatment and not impair dimensional stability.

A prior art technique relating to the above-mentioned subbing layer comprising double layers has been disclosed, for example, in Japanese Provisional Patent Publications No.

86648/1992, No. 96055/1992, No. 184335/1992, No. 184431/1992, etc. In the methods disclosed in these references, it is important to set the heat treatment conditions after coating a subbing layer, so that these methods could not show stable adhesive properties (without effecting the heat treatment) over a wide range of the heat treatment conditions after coating a subbing layer and adhesive was also not sufficient.

The case of a subbing layer with a single layer as mentioned above has an advantage that an affect to dimensional stability accompanied by the heat treatment of the second layer can be avoided. Also, when a subbing layer with a single layer comprising a hydrophobic latex or an emulsion is carried out, coating of the subbing layer can be carried out before or during the stretching step so that there are advantage that a coating width can be narrowed as compared with that after stretching so that uniformity of coating can be easily ensured as compared with the second layer undercoating. Also, it is a subbing layer with a single layer so that there is an advantage that separate coating and drying apparatus required for the subbing layer comprising double layers is not necessary.

As another embodiment according to the present invention, there is an embodiment in which a second layer among the two-layered subbing layers as mentioned above and at least one layer containing gelatin which constitutes the silver halide photographic light-sensitive material are simultaneously multi-layer coated to prepare the material. That is, a first subbing layer constituted by a hydrophobic latex or an emulsion is previously provided on a polyester film, then, on the first subbing layer, a second subbing layer containing a water-soluble polymer and a self-emulsifiable isocyanate compound and a gelatin-containing layer constituting a silver halide photographic light-sensitive material are simultaneously multi-layer coated to form a light-sensitive material. Here, as the gelatin-containing layers constituting the silver halide photographic light-sensitive material, there maybe mentioned, for example, a silver halide emulsion layer, an undercoating layer, an overcoating layer or a backing layer. One layer of these gelatin-containing layers or two or more thereof is simultaneously multi-layer coated with the above-mentioned second subbing layer. As the water-soluble polymer of the above-mentioned second subbing layer, gelatin is preferably used. As the coating system to be used for the simultaneous multi-layer coating method, there may be preferably used a slide bead coating system or a curtain coating system.

As described above, the reason why coating of the second subbing layer can be carried out at the time of preparing a silver halide photographic light-sensitive material is based on the fact that the self-emulsifiable isocyanate compound in the second subbing layer effectively acts as a cross-linking agent without carrying out heat treatment at the time of forming the subbing layer and the second subbing layer shows sufficient adhesive property required as the subbing layer.

As an example of a prior art which becomes a reference, there may be mentioned, for example, a subbing layer for a polyester film by a non-aqueous coating comprising a solvent-soluble resin such as a polyisocyanate and a polyester resin, etc. as disclosed in Japanese Provisional Patent Publication No. 175009/1997. In this example, by providing a subbing layer, it is shown that adhesive property can be improved when an aqueous coating layer is provided thereon. However, this reference does not show the undercoating constitution for a polyester film support for the use of a silver halide photographic light-sensitive material according to the present invention. Particularly when it is dipped in a strongly alkaline solution in a developing treatment, it causes peeling at the interface with the support surface in some cases so that sufficient effects cannot be obtained. In the present invention, the subbing layer is an aqueous coating so that the surface of said subbing layer has high hydrophilicity and thus compatibility of the subbing layer and a hydrophilic polymer layer is markedly improved when said hydrophilic polymer is coated thereon as compared with a solvent type coating is to be carried out. Thus, more firm adhesiveness can be obtained.

The silver halide photographic light-sensitive material which is an object of the present invention has at least one silver halide emulsion layer on the polyester film support on which the above-mentioned subbing layer is coated. As such a silver halide photographic light-sensitive material, there may be mentioned a film for making plate, a color negative film, a color positive film, a black and white film, an X-ray film for medical use, a scanner film and a lithographic printing plate. These silver halide photographic light-sensitive materials have a halation preventive layer, an intermediate layer, a protective layer and a backing layer in addition to the silver halide emulsion layer. In these constitutional layers, gelatin has generally been used, and the subbing layer of the present invention shows an excellent effect of having good adhesiveness to the gelatin layer.

The light-sensitive silver halide photographic layer is generally treated by an alkaline developing solution with a pH of 9 to 14, and peeling of the film or scuff mark is likely occurred based on poor adhesion of the support and the gelatin layer during the developing treatment. The subbing layer of the present invention can provide adhesive property which can endure the treatment by such an alkaline developing solution.

Also, a lithographic printing plate using silver halide (for example, a lithographic printing plate utilizing the above-mentioned silver complex diffusion transfer method) is subjected to printing by applying ink and an dampening water to the plate surface. However, if the adhesiveness between the support and the gelatin layer is insufficient, there is a problem that a silver image portion formed on the gelatin layer or a non-image portion comprising the gelatin layer itself is partially dropped by mechanical abrasion or permeation of ink or the dampening water. The subbing layer of the present invention can provide adhesive property which can endure printing under such severe conditions.

Also, the silver halide photographic light-sensitive material is required to have dimensional stability and the polyester film support in which the subbing layer is provided of the present invention has markedly improved dimensional stability as compared with the conventional materials.

In the present invention, silver halide to be used in the silver halide photographic light-sensitive material is not particularly limited, and a surface latent image type silver halide emulsion is preferred. As the kind of silver halide, silver chloride, silver chlorobromide, silver chloroiodobromide, silver iodobromide, silver bromide, etc. may be used. When silver chloroiodobromide or silver iodobromide is used, the content of silver iodide is preferably used in the range of 5 mol % or less. The shape, crystal habit, grain diameter distribution of the silver halide particles are not particularly limited, and the particle size is preferably 0.7 $\mu$m or less. The silver halide emulsion can be sensitized by using a gold compound such as chloroaurate, auric trichloride, etc., a salt of a noble metal such as rhodium and iridium, a sulfur compound which forms silver sulfide by reacting with a silver salt, a stannous salt, or a reductive substance such as an amine without coarsening the particles. Also, it is possible to exist a salt of a noble metal such as rhodium and iridium, or an iron compound such as red prussiate of potash (potassium ferricyanide) at the time of physical ripening or nuclear formation of the silver halide particles.

In the present invention, the surface latent type silver halide emulsion means an emulsion which comprises silver halide particles having a higher surface sensitivity than that of an inner sensitivity. This emulsion preferably has a difference of the surface sensitivity and the inner sensitivity as regulated in U.S. Pat. No. 4,224,401. The silver halide emulsion is desirably a mono-dispersed and particularly preferably those having monodispersibility as regulated in the above-mentioned U.S. Pat. No. 4,224,401. The silver halide emulsion to be used in the present invention preferably contains a water-soluble rhodium salt (for example, rhodium dichloride, rhodium trichloride, potassium rhodium (III) acid hexachloride, ammonium rhodium (III) acid hexachloride, etc.). An amount of the rhodium salt to be added is preferably $1 \times 10^{-7}$ mol to $1 \times 10^{-4}$ mol per mole of silver halide. An average particle size of the silver halide to be used in the present invention is preferably 0.7 µm or less, particularly preferably in the range of 0.1 to 0.4 µm. The shape of the silver halide particles may be a regular shape such as cubic, octahedral, etc., or may be a mixed crystal shape, but preferably the particle size distribution of which being relatively narrow, i.e., the so-called monodispersed emulsion. The term "monodispersed emulsion" herein mentioned means an emulsion in which 90%, more preferably 95% of the total grains exists in crystal grain size region of an average grain size ±40%. A system for reacting a soluble silver salt for adjusting a silver halide emulsion and a soluble halogen salt of the present invention may be employed any means such as a single jet method, a double jet method, a reverse-mixing method formed under excessive silver ions, but for the purpose of the present invention, a double jet method in which a soluble silver salt and a soluble halogen salt are simultaneously added to an acidic solution to form particles is particularly preferred. The silver halide emulsion thus prepared may be or may not be chemically sensitized. When chemical sensitization is to be carried out, usually employed sulfur sensitization, selenium sensitization, tellurium sensitization, reduction sensitization, etc. may be employed.

The silver halide emulsion to be used in the present invention may be spectrally synthesized by a methyne dye, or others. The dyes to be used may include a cyanine dye, a merocyanine dye, a complex cyanine dye, a complex merocyanine dye, a holopolar cyanine dye, a hemicyanine dye, a styryl dye, and a hemioxonol dye. Particularly useful dyes are dyes belonging to a cyanine dye, a merocyanine dye, and a complex merocyanine dye. These sensitizing dyes may be used singly or in combination of two or more. Combination of the sensitizing dyes is often used particularly for the purpose of supersensitization. In addition to the sensitizing dye, a dye which has no spectral sensitizability or a substance which does not substantially absorb visible rays and shows supersensitizability may be also contained in an emulsion.

In the silver halide photographic light-sensitive material of the present invention, a hydrazine compound may be added to the silver halide emulsion layer. Also, a hydrophilic colloid layer may be provided adjacent to the surface latent image type silver halide emulsion layer. Such a layer may be any layer having any functions so long as it does not prevent the hydrazine compound from diffusing into silver halide particles, such as a subbing layer, an intermediate layer, a filter layer, a protective layer, an antihalation layer, etc. An amount of the hydrazine compound in the layer may vary depending on the characteristics of the silver halide emulsion to be used, a chemical structure of the compound and developing conditions so that a suitable amount may change with a wide range, but as for the hydrazine compound, it is practically available in an amount of about $1 \times 10^{-6}$ to $1 \times 10^{-2}$ mole per mole of silver in the surface latent type silver halide emulsion. Moreover, in addition to the hydrazine compound, an amine compound or a phosphonium compound which is a hardening promoting agent may be added to the emulsion layer and other layers.

When the hydrazine compound is added to the silver halide emulsion layer, a conventional safe light dye may be added to the emulsion layer or other hydrophilic colloid layers. To the photographic emulsion to be used in the present invention may be added various compounds for the purpose of preventing fogging in the preparation step, during preservation or during photographic processing of a silver halide photographic light-sensitive material, or stabilizing photographic properties. That is, many kinds of compounds conventionally known as antifoggants or stabilizers, i.e., azoles such as a benzothiazolium salt, a nitroimidazole, a nitrobenzimidazole, a chlorobenzimidazole, a mercaptothiazole, a mercaptobenzothiazole, a mercaptothiadiazole, an aminotriazole, a benzotriazole, a mercaptotetrazole, a mercaptopyrimidine, a mercaptotriazine, a thioketo compound, an azeindene, etc. Of these, particularly preferred are a benzotriazole (e.g., a 5-methylbenzotriazole) and a nitroindazole (e.g., 5-nitroindazole).

As a binder (a protective colloid) to be used in the silver halide emulsion layer, an intermediate layer, a protective layer, a backing layer or a halation preventive layer (an undercoating layer), etc. of the silver halide photographic light-sensitive material of the present invention, gelatin can be advantageously used, but a hydrophilic colloid other than gelatin can be used. For example, there may be used a gelatin derivative, a graft polymer of gelatin and other polymer, proteins such as albumin, casein, etc., a cellulose derivative such as hydroxyethyl cellulose, carboxymethyl cellulose, cellulose sulfuric acid ester, a starch derivative such as sodium alginate, starch derivative, etc., various kinds of synthetic hydrophilic polymer substance including homopolymer or copolymer such as polyvinyl alcohol, partial acetal of polyvinyl alcohol, poly-N-vinyl pyrrolidone, polyacrylic acid, polyacrylamide, polyvinyl imidazole, etc. As gelatin, in addition to a lime-treated gelatin, there may be used an enzyme-treated gelatin as disclosed in Bull. Soc. Sci. Photo. Japan, No. 16, p. 30 (1966), and a hydrolyzate or enzyme decomposed product of gelatin may be used.

In the light-sensitive photographic material of the present invention, an inorganic or organic hardener may be contained in the silver halide emulsion layer and other constitutional layers (a hydrophilic colloid layer). For example, a chromium salt (chromiumalum, etc.), an aldehyde (formaldehyde, glyoxal, etc.), an N-methylol compound, a dioxane derivative (2,3-dihydroxydioxane, etc.), an active vinyl compound, an active halogen compound (2,4-dichloro-6-hydroxy-s-triazine, etc.), and the like may be used singly or in combination thereof. To the light-sensitive silver halide emulsion layer or an adjacent layer thereof may be added a compound disclosed in Research Disclosure, No. 17465, Item XXI, B to D for the purpose of promoting development. It is particularly preferred to add polyethylene glycol or a derivative thereof.

In the light-sensitive photographic material of the present invention, a water-insoluble or difficultly soluble synthetic polymer decomposed material may be contained in the silver halide emulsion layer and other constitutional layers (a hydrophilic colloid layer) for the purpose of improving dimensional stability. For example, there may be used a polymer comprising, as a monomer component, an alkyl (meth)acrylate, an alkoxyalkyl (meth)acrylate, a glycidyl (meth)acrylate, (meth)acrylamide, vinyl acetate, acrylonitrile, an olefin, styrene singly or in combination thereof, or a combination of the above monomer and acrylic acid, methacrylic acid, an $\alpha,\beta$-unsaturated dicarboxylic acid, a hydroxyalkyl (meth)acrylate, styrene sulfonic acid, etc.

A preferred embodiment of a lithographic printing plate (a lithographic printing plate utilizing the silver complex diffusion transfer method) having a silver halide emulsion layer of the present invention comprises on a support, an undercoating layer which has a function as a halation preventive layer, a silver halide emulsion layer and a physical development nuclei layer in this order. As a physical development nuclei contained in the physical development nuclei layer, there may be mentioned metal fine particles such as silver, antimony, bismuth, cadmium, cobalt, nickel, lead, palladium, rhodium, gold, platinum, etc., a sulfide, polysulfide or selenide of these metals or a mixture thereof, or may be mixed crystal. A hydrophilic binder may not be contained in the physical development nuclei layer, but gelatin, starch, dialdehyde starch, various kinds of cellulose derivatives such as hydroxyethyl cellulose, hydroxypropyl cellulose, carboxymethyl cellulose, etc., gum Arabic, sodium alginate, other polysaccharide water-soluble polymer, polyacrylamide (and a copolymer thereof), polyacrylic acid (and a copolymer thereof), polyvinyl pyrrolidone (and a copolymer thereof), other various kinds of synthetic water-soluble polymer may be added, and an amount thereof is preferably 0.5 g to 3 g or less per m$^2$ of the lithographic printing plate. Moreover, in the physical development nuclei layer, a developing agent such as hydroquinone, methylhydroquinone, catechol, etc., or a hardening agent such as formalin and other known hardening agent may be contained.

In the undercoating layer (a layer having a function of halation preventive effect or cushion effect, etc.) of the lithographic printing plate according to the present invention, in addition to gelatin, various kinds of hydrophobic latex or emulsion as exemplified above may be contained. Moreover, for preventing halation, pigments such as carbon black, etc., or various kinds of dyes may be preferably added thereto. Furthermore, inorganic fine particles such as titanium oxide, silica, etc., may be added thereto as a matting agent, and other various kinds of additives for photography may be added thereto. Such an undercoating layer is disclosed in, for example, Japanese Provisional Patent Publications No. 5503/1973, No. 100203/1973, No. 16507/1974, No. 80518/1993, etc.

In the lithographic printing plate of the present invention, an inorganic or organic hardener may be contained in the undercoating layer, the silver halide emulsion layer, the physical development nuclei layer and other hydrophilic colloid layers. For example, a chromium salt (chromium alum, etc.), an aldehyde (formaldehyde, glyoxal, etc.), an N-methylol compound, a dioxane derivative (2,3-dihydroxydioxane, etc.), an active vinyl compound, an active halogen compound (2,4-dichloro-6-hydroxy-s-triazine, etc.), and the like may be used singly or in combination thereof. To the light-sensitive silver halide emulsion layer or an adjacent layer thereof may be added a compound disclosed in Research Disclosure, No. 17465, Item XXI, B to D for the purpose of promoting development. It is particularly preferred to add polyethylene glycol or a derivative thereof.

In the lithographic printing plate of the present invention, a water-insoluble or difficultly soluble synthetic polymer decomposed material may be contained in the undercoating layer, the silver halide emulsion layer and other hydrophilic colloid layers for the purpose of improving dimensional stability. For example, there may be used a polymer comprising, as a monomer component, an alkyl (meth) acrylate, an alkoxyalkyl (meth)acrylate, a glycidyl(meth) acrylate, (meth)acrylamide, vinyl acetate, acrylonitrile, an olefin, styrene singly or in combination thereof, or a combination of the above monomer and acrylic acid, methacrylic acid, an $\alpha,\beta$-unsaturated dicarboxylic acid, a hydroxyalkyl (meth)acrylate, styrene sulfonic acid, etc.

In the present invention, the above-mentioned self-emulsifiable isocyanate compound may be added to the gelatin layer constituting the light-sensitive photographic material. In this case, an amount of the self-emulsifiable isocyanate compound is preferably in the range of 0.1 part by weight to 200 parts by weight based on 100 parts by weight of gelatin. If an amount is less than the above range, cross-linking property is poor and the effect of the present invention can be hardly admitted, while if it exceeds 200 parts by weight, tackiness of the coated surface is remarkable due to an ethyleneoxy group so that it is not preferred.

In the present invention, by using the above-mentioned self-emulsifiable isocyanate compound in the silver halide photographic light-sensitive material as a cross-linking agent of gelatin, preferred characteristics can be obtained. That is, by adding the self-emulsifiable isocyanate compound to at least one of gelatin layers constituting the silver halide photographic light-sensitive material, without causing any bad effect to the photographic characteristics or preservability of the silver halide photographic light-sensitive material, it has characteristics, for example, that adhesiveness with the support is improved as an anchor coat layer or flaw or scuff fogging can be effectively prevented as an overcoating layer. In addition to the above, it may be applied to either of the cases of a silver halide emulsion layer or a back coating layer.

The above-mentioned self-emulsifiable isocyanate compound may be added to the gelatin layer constituting the lithographic printing plate utilizing the silver complex diffusion transfer system. By adding the self-emulsifiable isocyanate compound to at least one of the gelatin layers constituting the lithographic printing plate as a cross-linking agent, without causing any bad effect to the photographic characteristics or preservability of the lithographic printing plate, adhesiveness with the support can be improved and good printing endurance can be obtained. The self-emulsifiable isocyanate compound can be applied to either of the undercoating layer, the silver halide emulsion layer, the physical development nuclei layer and the back coating layer, etc. constituting the lithographic printing plate. Of these, by applying it to the undercoating layer which is the undermost layer among the layers constituting the lithographic printing plate, adhesiveness with the support is strengthened and printing endurance is improved. In addition to the above, when it is applied to the silver halide emulsion layer, adhesiveness with the both layers sandwiching the layer, i.e., to the undercoating layer and to the physical development nuclei layer whereby preferred effect in improvement of printing endurance can be admitted.

When the self-emulsifiable isocyanate compound is added to the physical development nuclei layer, an effect of firmly adhering physical development silver to the surface thereof can be admitted whereby it is preferably used. When it is applied to the back coating layer, adhesiveness with the support is similarly improved so that it is preferred.

As the cross-linking agent to the gelatin, various kinds of materials conventionally used may be mentioned. However, there is no substance which satisfies all the properties of stability (usable time) in an aqueous solution in which it is mixed with gelatin, etc., cross-linking property (speed and cross-linking degree) at the time of film formation and post-hardening film (cross-linking with a lapse of time). As for a material a usable time of which is short, a particular device is provided for effecting mixing immediately before use in which the cross-linking agent is added to the coating solution immediately before coating, or when the cross-linking speed is slow or when post-film hardening exists, a product after coating is stored in a humid warehouse to be carried out a moistening treatment step so that they are troublesome. Moreover, in a light-sensitive photographic material containing various kinds of additives, it is the present status depending on the cross-linking agents, many of them cause remarkable bad effect to the photographic characteristics or preservability.

The self-emulsifiable isocyanate compound to be used as a cross-linking agent according to the present invention does not have the above-mentioned various problems and shows advantageous characteristics in the preparation of a silver halide photographic light-sensitive material and a lithographic printing plate. In combination with gelatin, the compound effectively carries out cross-linking reaction, causes no bad effect to the photographic characteristics, and suffers no effect to the photographic characteristics with a wide range of drying conditions (drying temperature and speed, etc.) at the time of preparing the lithographic printing plate. In this field of the art, it is well known that setting of drying conditions is extremely important, and particularly when a gelatin film is subjected to dehydrating and shrinkage due to cross-linking under high-speed drying conditions, there are problems that it generates reticulation, or causes fogging by the reasons of remaining residual stress in the gelatin film to exert a pressure to silver halide crystals. To the problems based on the drying conditions, it was found the effects that occurrence of reticulation or occurrence of fogging could be prohibited by adding the self-emulsifiable isocyanate compound. As a reason of showing these effects, whereas it is an assumption, it can be considered that there is a space between the isocyanate groups which are cross-linking points by an alkyl group such as a hexamethylene group, which provides a suitable space for flexible movement of the cross-linking points whereby excessive stress strain of the gelatin film can be prevented.

EXAMPLES

In the following, the present invention is explained in more detail by referring to Examples, but the present invention is not limited by these Examples nor effects thereof. All parts in Examples mean parts by weight.

Example 1

On a polyethylene terephthalate film support with a thickness of 100 μm was provided a subbing layer comprising a single layer with the following composition. A dried film thickness of the subbing layer was so coated and dried as to 0.2 μm.

(Subbing layer A-1)
Aqueous-dispersion type polyurethane emulsion (PERMARINE UA-200, trade name, available from Sanyo Kasei Kogyo K.K.)
(Subbing layer A-2)
Aqueous-dispersion type polyurethane emulsion (PERMARINE UA-200, trade name, available from Sanyo Kasei Kogyo K.K.) and an epoxy compound (DENACOL EX-521, trade name, available from Nagase Sangyo K.K.) are contained in amounts of both 10% by weight as solid components based on the above-mentioned polyurethane.
(Subbing layer A-3)
Aqueous-dispersion type polyurethane emulsion (PERMARINE UA-200, trade name, available from Sanyo Kasei Kogyo K.K.) and a block isocyanate compound (ELASTRON BN-44, trade name, available from Daiichi Kogyo Seiyaku K.K.) are contained in amounts of both 10% by weight as solid components based on the above-mentioned polyurethane.
(Subbing layer A-4)
Aqueous-dispersion type polyurethane emulsion (PERMARINE UA-200, trade name, available from Sanyo Kasei Kogyo K.K.) and hexamethylol melamine are contained in amounts of both 10% by weight as solid components based on the above-mentioned polyurethane.
(Subbing layer A-5)
Aqueous-dispersion type polyurethane emulsion (PERMARINE UA-200, trade name, available from Sanyo Kasei Kogyo K.K.) and a self-emulsifiable isocyanate compound (DURANATE WB40-80, trade name, available from Asahi Kasei Kogyo Seiyaku K.K.) are contained in amounts of both 10% by weight as solid components based on the above-mentioned polyurethane.
(Subbing layer A-6)
Aqueous-dispersion type polyurethane emulsion (PERMARINE UA-200, trade name, available from Sanyo Kasei Kogyo K.K.) and a self-emulsifiable isocyanate compound (DURANATE WX-1741, trade name, available from Asahi Kasei Kogyo Seiyaku K.K.) are contained in amounts of both 10% by weight as solid components based on the above-mentioned polyurethane.

On the above-mentioned 6 kinds of subbing layers, a silver halide emulsion layer and an overcoating layer with the compositions as mentioned below are coated and dried to prepare a silver halide photographic light-sensitive material.
(Silver halide emulsion layer)
According to the control double jet method, a monodispersed silver chlorobromide emulsion (silver chloride: 70 mol %) containing iridium and having an average particle size of 0.25 μm was prepared. By the flocculation method, desalting, washing, and redissolving were carried out, and 6-methyl-4-hydroxy-1,3,3a,7-tetrazaindene was so added that an amount thereof becomes 2 g/m$^2$, and then, anhydro-5,5'-dichloro-9-ethyl-3,3'-di-(3-sulfopropyl) oxacarbocyanine hydroxide pyridinium was so added as a sensitizing dye that an amount thereof becomes 0.2 g/m$^2$. To the thus obtained emulsion were added 2.5 g/m$^2$ of gelatin, 0.1 g/m$^2$ of polyethylene glycol and a surfactant, and then, 2-hydroxy-4,6-dichloro-1, 3,5-triazine sodium salt was so added as a hardening agent that an amount thereof becomes 1% by weight based on the total gelatin amount. The solution was so coated that a silver amount becomes 3.5 g/m$^2$.
(Overcoating layer)
It comprises gelatin (1 g/m$^2$), a surfactant and 2-hydroxy-4,6-dichloro-1,3,5-triazine sodium salt (3% by weight based on the amount of gelatin).

The respective silver halide photographic light-sensitive materials prepared as mentioned above were heated at 40° C. for 7 days. Adhesivenesses of the thus obtained respective samples were evaluated by using an alkaline solution. (Adhesive test with alkaline solution)

Lattice state scratches with 1 cm square were provided to the coated surface by using a cutter knife, and after dipping the material in a 3N aqueous sodium hydroxide solution for 10 minutes, adhesiveness with the substrate was evaluated by strongly scraping the surface with water-moisturized absorbent cotton. By scraping the film surface, the case where the silver halide emulsion layer peeled off is evaluated as X, partially peeled off is evaluated as Δ, and no peeling is admitted is evaluated as ○. The respective evaluation results are shown in Table 1.

TABLE 1

| Sample | Subbing layer | Alkali adhesion | Remarks |
|---|---|---|---|
| 1 | A-1 | X | Comparative |
| 2 | A-2 | X | Comparative |
| 3 | A-3 | X | Comparative |
| 4 | A-4 | X | Comparative |
| 5 | A-5 | ○ | This invention |
| 6 | A-6 | ○ | This invention |

As can be seen from the above results, the subbing layers A-5 and A-6 using the self-emulsifiable isocyanate compounds of the present invention show excellent adhesive property in an alkaline solution even when it is a single layer.

Example 2

In the same manner as in Example 1 except for changing the aqueous-dispersion type polyurethane emulsion of the subbing layer in Example 1 to a different kind of aqueous-dispersion type polyurethane emulsion (PERMARINE UA-310, trade name, available from Sanyo Kasei Kogyo K.K.), compositions B-1 to B-6 for preparing subbing layers were prepared, and coated on a polyethylene terephthalate film support and dried. Then, in the same manner as in Example 1, a silver halide emulsion layer and an overcoating layer were formed by coating thereon to prepare silver halide photographic light-sensitive materials. In the same manner as in Example 1, adhesiveness by the alkaline solution was tested. As a result, in samples of using the comparative subbing layers B-1 to B-4, peeling the film was observed. However, in samples of using the subbing layers B-5 and B-6 of the present invention, no peeling of the film was observed.

Example 3

In the same manner as in Example 1 except for changing the aqueous-dispersion type polyurethane emulsion of the subbing layer in Example 1 to a vinylidene chloride emulsion (L536B, trade name, available from Asahi Kasei Kogyo K.K., vinylidene chloride content: 90% or more, hydroxyl group-modified latex), compositions C-1 to C-6 for preparing subbing layers were prepared, and coated on a polyethylene terephthalate film support and dried. Then, in the same manner as in Example 1, a silver halide emulsion layer and an overcoating layer were formed by coating thereon to prepare silver halide photographic light-sensitive materials. In the same manner as in Example 1, adhesiveness by the alkaline solution was tested. As a result, in samples of using the comparative subbing layers C-1 to C-4, peeling the film was observed. However, in samples of using the subbing layers C-5 and C-6 of the present invention, no peeling of the film was observed.

Example 4

In the same manner as in Example 1 except for changing the aqueous-dispersion type polyurethane emulsion of the subbing layer in Example 1 to a hydrolyzable resin emulsion (SANMOL SW-131, trade name, available from Sanyo Kasei Kogyo K.K.), compositions D-1 to D-6 for preparing subbing layers were prepared and coated on a polyethylene terephthalate film support and dried. Then, in the same manner as in Example 1, a silver halide emulsion layer and an overcoating layer were formed by coating thereon to prepare silver halide photographic light-sensitive materials. In the same manner as in Example 1, adhesiveness by the alkaline solution was tested. As a result, in samples of using the comparative subbing layers D-1 to D-4, peeling the film was observed. However, in samples of using the subbing layers D-5 and D-6 of the present invention, no peeling of the film was observed.

Example 5

Next, an example of proofing superiority of the present invention in a subbing layer comprising double layers is shown. At the time of film formation of a polyethylene terephthalate film with a thickness of 100 $\mu$m, a first subbing layer comprising a vinylidene chloride latex (L536B, trade name, available from Asahi Kasei Kogyo K.K., vinylidene chloride content: 90% or more, hydroxyl group-modified latex) was inline-coated so that a dried film thickness of 0.3 $\mu$m. On the first subbing layer, a second subbing layer composition shown in the following Table 2 was so coated that a dried film thickness of 0.3 $\mu$m, and dried to obtain a polyethylene terephthalate film support. Incidentally, an amount of Compound A contained in the second subbing layer is 10% by weight based on the amount of the resin. A support in which the resulting support had been subjected to heat treatment in a drier controlled at 120° C. or 150° C. for 3 minutes was also prepared.

Next, the silver halide emulsion layer and the overcoating layer as in Example 1 were provided by coating on the above-mentioned respective supports, respectively, and dried to prepare silver halide photographic light-sensitive materials. After heating these samples at 40° C. for 7 days, alkaline solution adhesiveness and dimensional stability were evaluated.

With regard to dimensional stability, each sample was cut to a width of 30 cm and a length of 60 cm, and after rehumidification was carried out for 2 hours under temperature at 20° C. and humidity of 20%, it was closely contacted with a film original to which 10 fine lines were drawn with a distance of 5 cm by using a closed contact printer to effect exposure whereby a sample subjected to developing treatment was prepared. Then, after subjecting to rehumidification under the same conditions for 2 hours, slippage of fine lines from the original was measured to effect evaluation. The numerical values are shown slippage between fine lines corresponding to the developed sample against 50 cm width of the original in terms of micron unit. The smaller value means more excellent. The evaluation results are shown in Table 2.

TABLE 2

| Sample | Second subbing layer Resin | Second subbing layer Compound A | Heat treatment | Alkali adhesiveness | Dimensional stability | Remarks |
|---|---|---|---|---|---|---|
| 7 | Gelatin | WB-40 | untreated | ○ | +30 μm | This invention |
| 8 | Gelatin | WB-40 | 120° C. | ○ | +38 μm | This invention |
| 9 | Gelatin | WB-40 | 150° C. | ○ | +40 μm | This invention |
| 10 | Gelatin/vinylidene chloride (7/3) | WX1741 | untreated | ○ | +28 μm | This invention |
| 11 | Gelatin/vinylidene chloride (7/3) | WX1741 | 120° C. | ○ | +35 μm | This invention |
| 12 | Gelatin/vinylidene chloride (7/3) | WX1741 | 150° C. | ○ | +40 μm | This invention |
| 13 | Gelatin | Epoxy | untreated | X | +70 μm | Comparative |
| 14 | Gelatin | Epoxy | 120° C. | X | +70 μm | Comparative |
| 15 | Gelatin | Epoxy | 150° C. | Δ | +80 μm | Comparative |
| 16 | Gelatin | Block isocyanate | untreated | X | +50 μm | Comparative |
| 17 | Gelatin | Block isocyanate | 120° C. | X | +50 μm | Comparative |
| 18 | Gelatin | Block isocyanate | 150° C. | Δ | +45 μm | Comparative |
| 19 | Gelatin | Hexamethylolmelamine | untreated | X | +80 μm | Comparative |
| 20 | Gelatin | Hexamethylolmelamine | 120° C. | X | +60 μm | Comparative |
| 21 | Gelatin | Hexamethylolmelamine | 150° C. | Δ | +65 μm | Comparative |

WB-40: Self-emulsifiable isocyanate compound (DURANATE WB40-80, trade name, available from Asahi Kasei Kogyo K.K.)
WX1741: Self-emulsifiable isocyanate compound (DURANATE WX-1741, trade name, available from Asahi Kasei Kogyo K.K.)
Epoxy: DENAKOL EX-521, trade name, available from Nagase Sangyo K.K.
Block isocyanate: ERASTRON BN-44, trade name, available from Daiichi Kogyo Seiyaku K.K.

As can be clearly seen from the above results, samples of the present invention show high adhesive property even when they are not subjected to heat treatment. To the contrary, in the samples of comparative purpose, adhesive property was not provided without effecting heat treatment and even when the heat treatment was carried out, adhesiveness was still insufficient. Also, the samples of the present invention are superior in dimensional stability to those of the comparative samples.

Example 6

In the same manner as in Example 5 except for changing the vinylidene chloride latex in the first subbing layer of Example 5 to an aqueous-dispersion type polyurethane emulsion (PERMARINE UA-310, trade name, available from Sanyo Kasei Kogyo K.K.), the same procedure was carried out. As a result, the same results as in Example 5 were obtained.

Example 7

Next, with regard to a lithographic printing plate utilizing the silver complex diffusion process, the following example was carried out to prove superiority of the present invention.

In the same manner as in Examples 1 to 4, polyester film supports to which the subbing layers A-1 to A-6, B-1 to B-6, C-1 to C-6, and D-1 to D-6 had been formed by coating and dried were prepared.

Onto the supports prepared as mentioned above were formed by coating the following undercoating layer, silver halide emulsion layer and physical development nuclei.

| Undercoating layer (Halation preventive layer) | |
|---|---|
| Gelatin | 35 parts |
| 2-Hydroxy-4,6-dichloro-1,3,5-triazine sodium salt | 7 parts |
| Water | 200 parts |
| Titanium oxide (TR-1, trade name, available from Sakai Kagaku Co.) | 50 parts |
| Water | 100 parts |
| Matting agent: SYLOID (Grade 978), trade name, available from Fuji Davidson Co. | 7.5 parts |
| Carbon black dispersion (Solid component: 30%) | 8 parts |
| Surfactant | 6 parts |
| Total amount was made 600 parts by addition of water. | |

The above-mentioned coating solution for preparing the undercoating layer (halation preventive layer) was coated with an amount of 60 g of solution per $m^2$, and dried. On the undercoating layer (halation preventive layer) was coated a high contrast silver chloride emulsion which had been ortho sensitized with an amount of 1.5 g (gelatin: 0.8 $g/m^2$) per $m^2$ in terms of silver nitrate, and dried. Formalin was used in the silver halide emulsion layer as a film-hardening agent. After drying, the sample was heated in a dryer controlled to 50° C. for 2 days, and according to Example 1 described in Japanese Provisional Patent Publication No. 211614/1996, a physical development nuclei solution was coated and dried to obtain a lithographic printing plate.

With respect to the thus prepared lithographic printing plates, adhesiveness and printing property were evaluated by the test methods as mentioned below.

(Adhesive test)

Lattice state scratches with 1 cm square were provided to the coated surface by using a cutter knife, and after dipping the plate in a 3N aqueous sodium hydroxide solution or in dimethylformamide (DMF) for each 10 minutes, adhesiveness with the substrate was evaluated by strongly scraping the surface with water-moisturized absorbent cotton. By scraping the film surface, the case where the silver halide emulsion layer peeled off is evaluated as X, partially peeled off is evaluated as Δ, and no peeling is admitted is evaluated as ○.

(Printing test)

The lithographic printing plate was exposed in accordance with an image, and then, developed with the following developing solution at 30° C. for 30 seconds, subsequently dipped in the following stabilizing solution for 30 seconds (25° C.) and squeezed to remove an excessive solution, and dried.

| Developing solution | |
|---|---|
| Water | 700 ml |
| Potassium hydroxide | 20 g |
| Anhydrous sodium sulfite | 50 g |
| 5-Phenyl-2-mercapto-1,3,4-oxadiazole | 1 g |
| 2-methylaminoethanol | 30 g |
| Potassium bromide | 5 g |
| Total amount was made 1 liter with addition of water. | |

| Stabilizing solution | |
| --- | --- |
| Water | 600 ml |
| Citric acid | 10 g |
| Sodium citrate | 35 g |
| Colloidal silica (20% liquid) | 5 ml |
| Ethylene glycol | 5 ml |
| Total amount was made 1 liter with addition of water. | |

The lithographic printing plates obtained by the above plate-making treatment were each mounted on an offset printing press Ryobi 3200CD (trade name), and after the plate surface was wiped with the following etching solution, printing was carried out by using the following dampening solution and ink (F Gloss Black B and F Gloss Indigo Dark Blue, both trade names, available from Dainippon Ink Co.). The above-mentioned F Gloss Indigo Dark Blue is one of inks which easily cause printing stain to said lithographic printing plate. Temperature at the time of printing was 22° C. and humidity was 60%.

| Etching solution | |
| --- | --- |
| Water | 600 ml |
| Isopropyl alcohol | 400 ml |
| Ethylene glycol | 50 ml |
| 2-Mercapto-5-heptyl-1,3,4-oxadiazole | 1 g |

| Dampening solution | |
| --- | --- |
| o-Phosphoric acid | 10 g |
| Nickel nitrate | 5 g |
| Sodium sulfite | 5 g |
| Ethylene glycol | 100 ml |
| Colloidal silica (20% liquid) | 28 g |
| Total amount was made 2 liters by addition of water. | |

Evaluation of printing property was carried out by judging from the degree of printing stain and printing endurance. With respect to printing stain, the case where completely no stain exists is evaluated as ◯, partial stain occurred is evaluated as Δ, and stain occurs at the front surface is evaluated as X. With regard to printing endurance, the case where 200,000 sheets or more of printing can be done without any failure is evaluated as ◯, printing failure such as lack of image, etc. occurred within 5,000 sheets or less of printing is evaluated as X, and therebetween is evaluated as Δ. These results are shown in Table 3.

TABLE 3

| Sample | Subbing layer | Adhesiveness Alkali | Adhesiveness DMF | Printing property Printing stain | Printing property Printing endurance | Remarks |
| --- | --- | --- | --- | --- | --- | --- |
| 22 | A-1 | X | X | ◯ | X | Comparative |
| 23 | A-2 | X | X | ◯ | X | Comparative |
| 24 | A-3 | X | X | ◯ | X | Comparative |
| 25 | A-4 | X | X | ◯ | X | Comparative |
| 26 | A-5 | ◯ | ◯ | ◯ | ◯ | This invention |
| 27 | A-6 | ◯ | ◯ | ◯ | ◯ | This invention |
| 28 | B-1 | X | X | ◯ | X | Comparative |
| 29 | B-2 | X | X | ◯ | X | Comparative |
| 30 | B-3 | X | X | ◯ | X | Comparative |
| 31 | B-4 | X | X | ◯ | X | Comparative |
| 32 | B-5 | ◯ | ◯ | ◯ | ◯ | This invention |
| 33 | B-6 | ◯ | ◯ | ◯ | ◯ | This invention |
| 34 | C-1 | X | X | ◯ | X | Comparative |
| 35 | C-2 | X | X | ◯ | X | Comparative |
| 36 | C-3 | X | X | ◯ | X | Comparative |
| 37 | C-4 | X | X | ◯ | X | Comparative |
| 38 | C-5 | ◯ | ◯ | ◯ | ◯ | This invention |
| 39 | C-6 | ◯ | ◯ | ◯ | ◯ | This invention |
| 40 | D-1 | X | X | ◯ | X | Comparative |
| 41 | D-2 | X | X | ◯ | X | Comparative |
| 42 | D-3 | X | X | ◯ | X | Comparative |
| 43 | D-4 | X | X | ◯ | X | Comparative |
| 44 | D-5 | ◯ | ◯ | ◯ | ◯ | This invention |
| 45 | D-6 | ◯ | ◯ | ◯ | ◯ | This invention |

As be clearly seen from the above results, samples of using the subbing layers according to the present invention show excellent adhesive property and printing property irrespective of the first subbing layer.

Example 8

Polyester film supports each having two-layers of subbing layers were prepared in the same manner as in Example 5. On these supports were provided by coating the undercoating layer, the silver halide emulsion layer and the physical development nuclei layer in the same manner as in Example 7 to prepare various kinds of lithographic printing plates. Printing endurances of the thus prepared lithographic printing plates were evaluated in the same manner as in Example 7. The results are shown in Table 4.

TABLE 4

| Sample | Second subbing layer Resin | Second subbing layer Compound A | Heat treatment | Printing endurance | Remarks |
| --- | --- | --- | --- | --- | --- |
| 46 | Gelatin | WB-40 | untreated | ◯ | This invention |
| 47 | Gelatin | WB-40 | 120° C. | ◯ | This invention |
| 48 | Gelatin | WB-40 | 150° C. | ◯ | This invention |
| 49 | Gelatin/-vinylidene chloride (7/3) | WX1741 | untreated | ◯ | This invention |
| 50 | Gelatin/-vinylidene chloride (7/3) | WX1741 | 120° C. | ◯ | This invention |

TABLE 4-continued

| Sample | Second subbing layer | | Heat treatment | Printing endurance | Remarks |
|---|---|---|---|---|---|
| | Resin | Compound A | | | |
| 51 | Gelatin/-vinylidene chloride (7/3) | WX1741 | 150° C. | ○ | This invention |
| 52 | Gelatin | Epoxy | untreated | X | Comparative |
| 53 | Gelatin | Epoxy | 120° C. | X | Comparative |
| 54 | Gelatin | Epoxy | 150° C. | Δ | Comparative |
| 55 | Gelatin | Block isocyanate | untreated | X | Comparative |
| 56 | Gelatin | Block isocyanate | 120° C. | X | Comparative |
| 57 | Gelatin | Block isocyanate | 150° C. | Δ | Comparative |
| 58 | Gelatin | Hexamethylolmelamine | untreated | X | Comparative |
| 59 | Gelatin | Hexamethylolmelamine | 120° C. | X | Comparative |
| 60 | Gelatin | Hexamethylolmelamine | 150° C. | Δ | Comparative |

From the results as mentioned above, samples of the present invention show excellent printing endurance even when they are not subjected to heat treatment. To the contrary, in the samples for comparative purpose, printing endurance was not good without effecting heat treatment and when the heat treatment was carried out, printing endurance was slightly improved but the effect is extremely small.

Example 9

In the same manner as in Example 8 except for changing the vinylidene chloride latex of the first subbing layer of Example 8 to an aqueous-dispersion type polyurethane emulsion (PERMARINE UA-310, trade name, available from Sanyo Kasei Kogyo K.K.), lithographic printing plates were prepared and their properties were evaluated. As a result, the same results as in Example 8 could be obtained.

Example 10

On a polyethylene terephthalate film support having a thickness of 100 μm was coated a polyurethane emulsion (PERMARINE UA-150, trade name, available from Sanyo Kasei Kogyo K.K.) as a first subbing layer to have a dried film thickness of 0.2 μm. On the support on which the above-mentioned first subbing layer had been coated, three layers of a second subbing layer (dried film thickness: 0.3 μm) and the silver halide emulsion layer and the overcoating layer in the same compositions as in Example 1 were simultaneously multi-layer coated according to the slide bead coating system and dried to obtain a silver halide photographic light-sensitive material. The second subbing layer according to the present invention comprises gelatin and a self-emulsifiable isocyanate compound (DURANATE WB40-80, trade name, available from Asahi Kasei Kogyo K.K.) in an amount of 10% by weight based on that of the gelatin in terms of solid contents. As a comparative sample, a silver halide photographic light-sensitive material was prepared by using an epoxy resin (DENAKOL EX-521, trade name, available from Asahi Kasei Kogyo K.K.) or a block isocyanate (ELASTRON BN-44, trade name, available from Daiichi Kogyo Seiyaku K.K.) in place of the self-emulsifiable isocyanate compound in the second subbing layer. When alkali adhesiveness was measured in the same manner as in Example 1, the sample of the present invention was ○, but both of the comparative samples were X.

Example 11

On a polyethylene terephthalate film support having a thickness of 100 μm was coated a polyurethane emulsion (PERMARINE UA-150, trade name, available from Sanyo Kasei Kogyo K.K.) as a first subbing layer to have a dried film thickness of 0.2 μm. On the support on which the above-mentioned first subbing layer had been coated, three layers of a second subbing layer (dried film thickness: 0.3 μm) and the undercoating layer and the silver halide emulsion layer in the same compositions as in Example 7 were simultaneously multi-layer coated according to the slide bead coating system and dried. Thereafter, according to Example 7, the material was subjected to heat treatment and physical development nuclei layer was coated and dried to obtain a lithographic printing plate according to the present invention. The second subbing layer according to the present invention comprises gelatin and a self-emulsifiable isocyanate compound (DURANATE WB40-80, trade name, available from Asahi Kasei Kogyo K.K.) in an amount of 10% by weight based on that of the gelatin in terms of solid contents. As a comparative sample, a lithographic printing plate was prepared by using an epoxy resin (DENAKOL EX-521, trade name, available from Asahi Kasei Kogyo K.K.) or a block isocyanate (ELASTRON BN-44, trade name, available from Daiichi Kogyo Seiyaku K.K.) in place of the self-emulsifiable isocyanate compound in the second subbing layer. When adhesiveness and press life of the respective samples were measured in the same manner as in Example 7, and the sample of the present invention was ○. In both of the comparative samples, the adhesiveness and press life were both X.

What is claimed is:

1. A silver halide photographic light-sensitive material which comprises a polyester film support, at least one subbing layer containing a self-emulsifiable isocyanate compound having an ethylene oxide recurring unit and two or more isocyanate groups on the support, and at least one silver halide emulsion layer provided on said subbing layer.

2. The silver halide photographic light-sensitive material according to claim 1, wherein said subbing layer is a single layer comprising a hydrophobic latex or emulsion and a self-emulsifiable isocyanate compound having an ethylene oxide recurring unit and two or more isocyanate groups.

3. The silver halide photographic light-sensitive material according to claim 2, wherein the latex is latex mainly comprising vinylidene chloride.

4. The silver halide photographic light-sensitive material according to claim 2, wherein the emulsion is an emulsion mainly comprising a polyurethane resin.

5. The silver halide photographic light-sensitive material according to claim 2, wherein the emulsion is a resin emulsion having a hydrolyzable silyl group.

6. The silver halide photographic light-sensitive material according to claim 1, wherein the subbing layer comprises two layers, and the first layer comprises a hydrophobic latex or emulsion, and the second layer comprises a water-soluble polymer and a self-emulsifiable isocyanate compound having an ethylene oxide recurring unit and two or more isocyanate groups.

7. The silver halide photographic light-sensitive material according to claim 6, wherein the latex is latex mainly comprising vinylidene chloride.

8. The silver halide photographic light-sensitive material according to claim 6, wherein the emulsion is an emulsion mainly comprising a polyurethane resin.

9. The silver halide photographic light-sensitive material according to claim 6, wherein the emulsion is a resin emulsion having a hydrolyzable silyl group.

10. The silver halide photographic light-sensitive material according to claim 6, wherein a second subbing layer and a gelatin-containing layer constituting the silver halide photographic light-sensitive material are simultaneously multilayer-coated on a first subbing layer provided on the polyester film support.

* * * * *